(12) United States Patent
Lo Hine Tong et al.

(10) Patent No.: US 7,343,139 B2
(45) Date of Patent: Mar. 11, 2008

(54) DEVICE FOR CONVERTING FREQUENCIES, METHOD OF CALIBRATING SAID DEVICE AND SYSTEM FOR TRANSMITTING/RECEIVING ELECTROMAGNETIC SIGNALS COMPRISING SUCH A DEVICE

(75) Inventors: Dominique Lo Hine Tong, Rennes (FR); Jean-Luc Robert, Betton (FR); Jean-Yves Le Naour, Pace (FR)

(73) Assignee: Thomson Licensing, Boulogne, Billancourt (FR)

( * ) Notice: Subject to any disclaimer, the term of this patent is extended or adjusted under 35 U.S.C. 154(b) by 427 days.

(21) Appl. No.: 11/147,839

(22) Filed: Jun. 8, 2005

(65) Prior Publication Data
US 2005/0277395 A1    Dec. 15, 2005

(30) Foreign Application Priority Data
Jun. 9, 2004  (FR) .................................. 04 51151

(51) Int. Cl.
*H04B 1/04* (2006.01)
(52) U.S. Cl. ................ 455/114.1; 455/114.2; 455/114.3; 455/296; 332/123; 332/124
(58) Field of Classification Search ............ 455/114.1, 455/114.2, 114.3, 296, 189.1, 295, 63.1, 67.11, 455/69, 570, 501, 522, 46, 456.5, 456.6, 455/425, 426, 550.1, 575.1; 332/123, 124, 332/160, 161, 162, 159, 163, 167; 375/346, 375/296, 297, 146, 344; 327/356, 358; 330/279, 330/149, 151
See application file for complete search history.

(56) References Cited

U.S. PATENT DOCUMENTS

| 4,618,999 | A | * | 10/1986 | Watkinson | .................. 455/108 |
| 5,021,753 | A | * | 6/1991 | Chapman | .................... 332/103 |
| 5,193,223 | A | * | 3/1993 | Walczak et al. | .......... 455/115.1 |
| 5,194,822 | A | * | 3/1993 | Bureau et al. | ............... 330/129 |
| 5,287,555 | A | * | 2/1994 | Wilson et al. | ............ 455/115.1 |

(Continued)

OTHER PUBLICATIONS

Itoh K., et al.: "Fundamental limitations on output power and conversion loss of an even harmonic mixer in an up-conversion operation" Microwave Sysmposium Digest, 1997, IEE MTT-S International Denver, CO, USA Jun. 8-13, 1997, New York, NY, USA, IEEE, US Jun. 8, 1997, pp. 849-852.

*Primary Examiner*—Edward F. Urban
*Assistant Examiner*—Charles Chow
(74) *Attorney, Agent, or Firm*—Joseph J. Laks; Vincent E. Duffy; Michael A. Pugel

(57) ABSTRACT

The invention relates to a device for converting frequencies comprising a local oscillator of fixed frequency and a first mixer with two inputs and an output, a first input receiving the signal to be converted and a second input receiving the signal arising from the local oscillator. It further comprises a second mixer with two inputs and an output, a first input receiving the signal arising from the phase-shifted local oscillator and the second input receiving a dc signal whose value is dependent on the power of the residual spectral component at the output of an adder receiving as input the signals arising from the first and from the second mixer(s) and giving as output a transposed signal. The invention applies in particular in terminals operating in the Ka band.

9 Claims, 4 Drawing Sheets

U.S. PATENT DOCUMENTS

| | | |
|---|---|---|
| 5,416,441 A * | 5/1995 | Nagano ........................ 330/129 |
| 5,457,424 A * | 10/1995 | McGinn et al. .............. 329/306 |
| 5,564,087 A * | 10/1996 | Cygan et al. ................ 455/126 |
| 5,656,972 A * | 8/1997 | Norimatsu ................... 330/129 |
| 5,793,817 A * | 8/1998 | Wilson ........................ 375/297 |
| 5,838,210 A * | 11/1998 | Midya et al. ................ 332/109 |
| 5,867,065 A * | 2/1999 | Leyendecker ................ 330/149 |
| 6,081,158 A * | 6/2000 | Twitchell et al. ............ 330/149 |
| 6,324,388 B1 | 11/2001 | Souetinov |
| 6,363,241 B1 | 3/2002 | Barakat et al. |
| 6,522,198 B2 * | 2/2003 | Ahn ............................ 330/149 |
| 6,757,525 B1 * | 6/2004 | Ishikawa et al. ........... 455/114.3 |
| 6,999,523 B2 * | 2/2006 | Posti ............................ 375/296 |
| 7,058,369 B1 * | 6/2006 | Wright et al. ............. 455/114.2 |
| 7,149,484 B2 * | 12/2006 | Nation ........................ 455/126 |
| 7,200,367 B1 * | 4/2007 | Wright et al. .................. 455/91 |
| 2002/0080892 A1 * | 6/2002 | Main et al. .................... 375/316 |
| 2002/0158622 A1 * | 10/2002 | Rayne et al. .............. 324/76.53 |
| 2002/0191710 A1 * | 12/2002 | Jeckeln et al. ............... 375/296 |
| 2003/0210093 A1 * | 11/2003 | Zhang ........................ 330/149 |
| 2004/0092237 A1 | 5/2004 | Chen |
| 2004/0132424 A1 * | 7/2004 | Aytur et al. .................. 455/335 |
| 2005/0221772 A1 * | 10/2005 | Nakano et al. ............ 455/114.1 |
| 2006/0182197 A1 * | 8/2006 | Godambe et al. ........... 375/297 |
| 2007/0042728 A1 * | 2/2007 | Pan .......................... 455/127.1 |
| 2007/0140378 A1 * | 6/2007 | Kato .......................... 375/302 |

* cited by examiner

US 7,343,139 B2

DEVICE FOR CONVERTING FREQUENCIES, METHOD OF CALIBRATING SAID DEVICE AND SYSTEM FOR TRANSMITTING/RECEIVING ELECTROMAGNETIC SIGNALS COMPRISING SUCH A DEVICE

This application claims the benefit under 35 U.S.C. § 119 of application number 04/51151 filed in France on Jun. 9, 2004.

FIELD OF THE INVENTION

The present invention relates to a device for converting frequencies, more particularly to a device of this type usable in a system for transmitting/receiving electromagnetic signals operating in frequency bands of the order of some 10 gigahertz (GHz).

The present invention also relates to a method of calibrating the device for converting frequencies as well as to a transmitting/receiving system including the said device for converting frequencies.

BACKGROUND OF THE INVENTION

Represented in FIG. 1 is an exemplary simplified conventional architecture of an RF (radio frequency) transmitter, more particularly a Ka band transmitter (29-30 GHz). As represented in the figure, the RF signal lying in the 950-1450 MHz band corresponding to the frequency band at the output of the indoor unit (IDU) is amplified by a variable gain amplifier 10. The signal output by the amplifier 10 is transposed into Ka bands, namely the band lying between 29.5-30 GHz. This transposition is carried out by a subharmonique mixer 11 and a local oscillator 12 operating in the Ku band. The output of the mixer 11 is sent through an amplifier 12 as input to a filtering element 13 whose major constraint is the rejection of the spectral component at 2FOL where FOL is the frequency of the local oscillator. The value of 2FOL is, for example, equal to 28.55 GHz, namely to a value very close to the value of the transmission band in the Ka band (29.5-30 GHz). The signal arising from the filtering device 13 is sent to a second amplifier 14 and a power amplifier 15 before reaching the transmission antenna 16. This very simple structure allows direct transposition in a single leap. Its main advantage is that it is cheaper than double transposition architectures. Specifically, the number of components and the area occupied by the circuits are reduced. Nevertheless, this technique considerably increases the constraints on the filtering of the transmission band so as to satisfy the international standards in force.

To obtain the rejection for the 2FOL component, as mentioned hereinabove, various filtering devices may be used.

It is in particular possible to use waveguide filters, more particularly filters embodied in thin layer/alumina technology, which allow selective filtering, in particular in the K or Ka bands. However, this technology is expensive and is incompatible with SMC (surface mounted component) technology on a cheap organic substrate.

The transposition chain such as described with reference to FIG. 1, comprises a subharmonique mixer. As represented diagrammatically in FIG. 2, the subharmonique mixers customarily used in this type of system comprise two Schottky diodes 20 and 21 arranged in an antiparallel manner in one and the same package 23. Thus, in a known manner, if the two diodes 20, 21 are identical, the dc components of the currents I1 and I2 flowing around the diodes are zero and the component at the frequency 2FOL on the RF output is nonexistent. As represented in FIG. 2, the package 23 comprising the two diodes 20, 21 is connected to earth through a circuit 25 and to a local oscillator LO by way of a circuit 24 comprising a network of filters and an impedance matching circuit for matching to the frequency of the local oscillator LO. The outputs of the circuits 24 and 25 are connected at a common point P1 to the input of the package 23. In a symmetric manner, to the other input/output point of the package 23 are connected, through a circuit 26 comprising a network of filters and an impedance matching circuit, the RF signal, and through a circuit 27 comprising a network of filters and an impedance matching circuit, the IF signal. In practice, in mixers of the type of that of FIG. 2, the Schottky diodes arranged in antiparallel manner are never perfectly paired. Hence, this results in a residual component of dc current in the loop due to the imbalance which gives rise to a component at the frequency 2OL at the RF output.

SUMMARY OF THE INVENTION

The present invention therefore relates to a frequency conversion device in which the residual component of dc current is maintained at its minimum value.

Thus, the present invention relates to a device for converting frequencies comprising a local oscillator of fixed frequency and a first mixer with two inputs and an output, a first input receiving the signal to be converted and a second input receiving the signal arising from the local oscillator, characterized in that it comprises a second mixer with two inputs and an output, a first input receiving the signal arising from the phase-shifted local oscillator and the second input receiving a dc signal whose value is dependent on the power of the residual spectral component at the output of an adder receiving as input the signals arising from the first and from the second mixer and giving as output a transposed signal.

In fact, the second mixer used in the device of the present invention is controlled by a dc voltage arising from a power detector connected at the output of the adder. The dc voltage thus obtained is representative of the power of the unwanted residual spectral component at the output of the summator. In accordance with the invention, this dc voltage has to be minimized by the device described hereinabove.

According to a particular embodiment, output of the power detector is sent to a processing means making it possible to determine the value of the dc signal to be applied as input to the second mixer. Preferably, the processing means consists of a microcontroller. Therefore, the dc voltage arising from the power detector is digitized with the aid of an analogue/digital converter, processed in the microcontroller so as to determine the direction of variation and the value of the voltage to be applied to the second mixer and then the signal thus obtained is retransformed into analogue by a digital/analogue converter with or without sign correction and level matching so as to control the second mixer. Preferably, the analogue/digital and digital/analogue converters are integrated into the microcontroller.

According to another characteristic of the present invention, the RF signal to be converted is amplified by a variable gain amplifier before being applied to the first mixer, the gain of the amplifier being controlled by a signal arising from the microcontroller.

The present invention also relates to a method of calibrating the device described hereinabove comprising the following steps:

on power-up, adjustment of the gain of the variable gain amplifier for operation with a minimum gain, measurement at the output of the power detector of the power of the component at 2OL, processing of the voltage delivered by the detector so as to determine the value of the dc voltage to be applied to the input of the second mixer, then, when the component at the frequency 2OL is minimized at output, setting of the gain of the variable gain amplifier to its nominal value.

The processing of the voltage at the output of the detector is carried out in a microcontroller implementing a convergence algorithm after digitization of the voltage. The microcontroller determines the direction of variation of the control voltage (positive or negative) so as to minimise the unwanted spectral component at the output of the summator.

The present invention relates to an outdoor unit for a transmitting/receiving system, more particularly a terminal transmitting in the Ka band comprising a frequency conversion device such as described hereinabove.

BRIEF DESCRIPTION OF THE DRAWINGS

Other characteristics and advantages of the present invention will become apparent on reading the description of a preferred embodiment of a frequency conversion device in accordance with the present invention, this description being offered with reference to the appended drawings in which.

DETAILED DESCRIPTION

Figure 1:
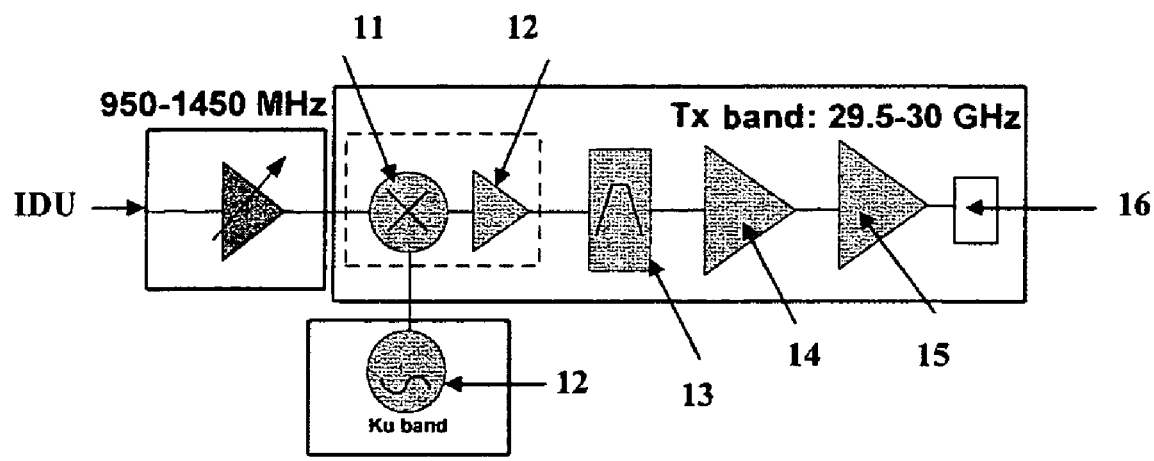
FIG. 1 already described is a simplified schematic representation of a Ka band transmitter, FIG. 2 already described is a very simplified schematic representation of a subharmonique mixer used in the transmitter of FIG. 1.
Figure 2:
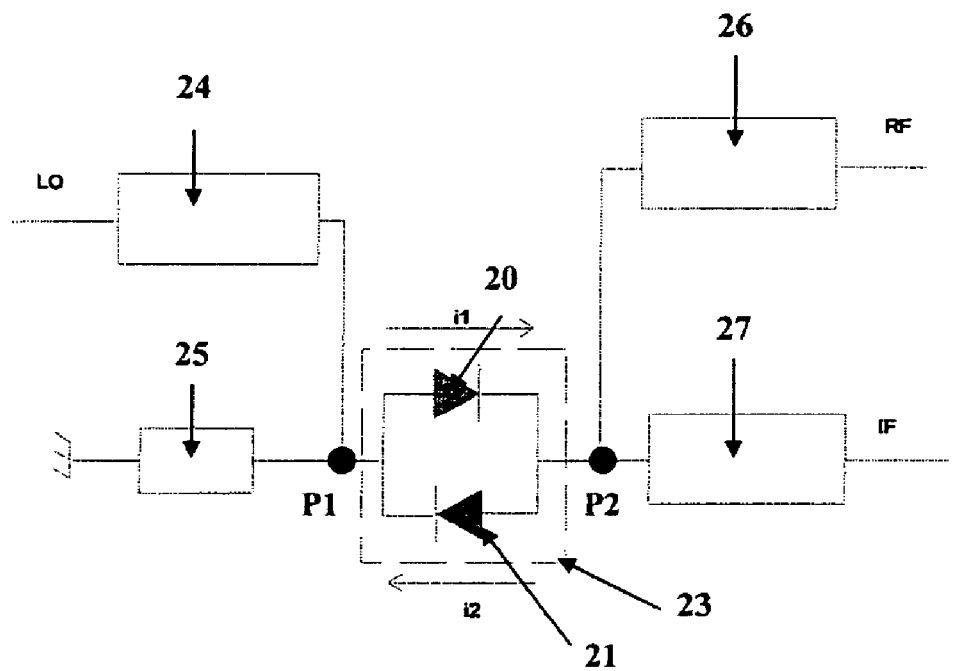
Figure 3:
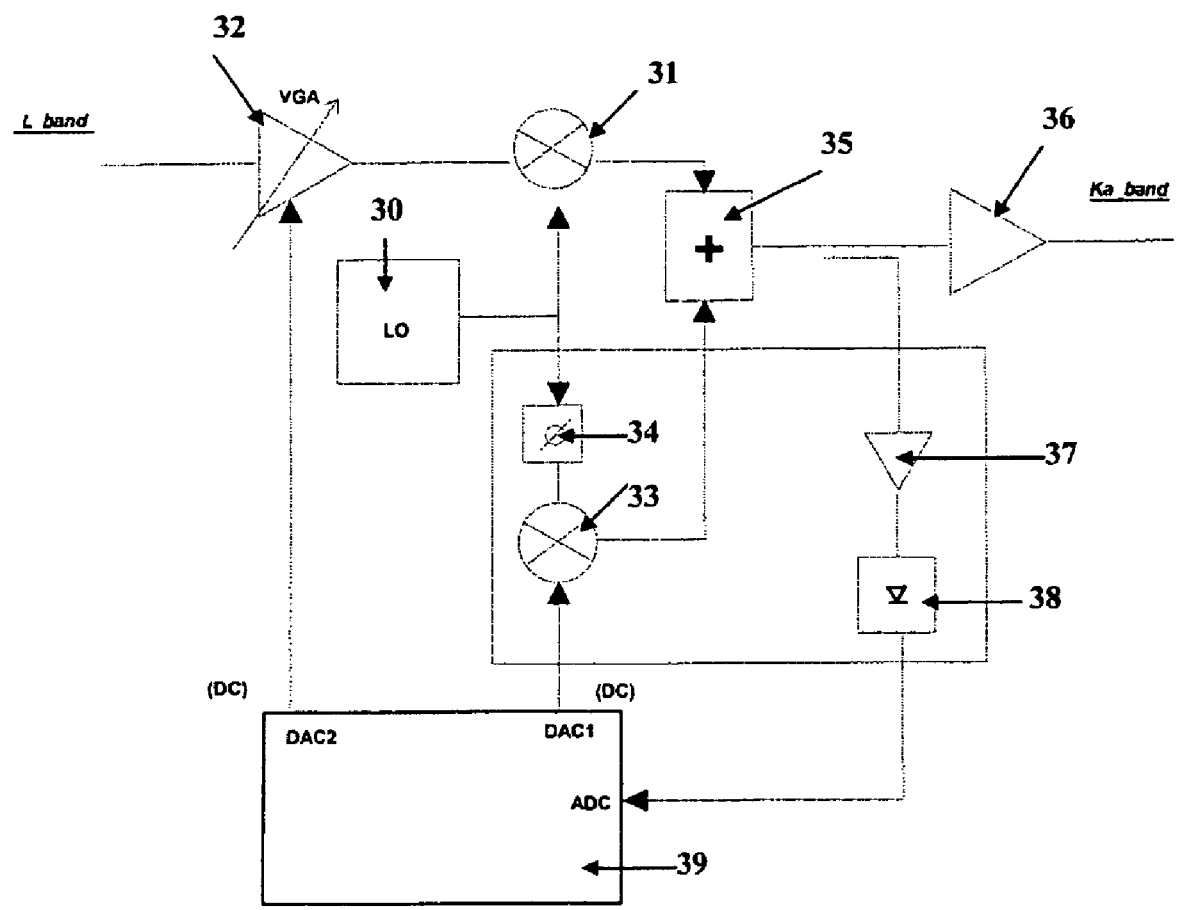
FIG. 3 is a simplified schematic of a frequency conversion device in accordance with the present invention.

Represented in FIG. 3 are the main elements of a frequency conversion device in accordance with the present invention. This device is integrated into an RF architecture transmitting in the Ka band and carrying out a simple transposition.

As represented in FIG. 3, the frequency conversion device essentially comprises a local oscillator 30 operating at a frequency OL in the Ku band, namely around 14.25 GHz. The output signal from the local oscillator 30 is sent to an input of a first subharmonique mixer 31. The mixer 31 receives on its other input the signal to be transposed. This signal is obtained at the output of a variable gain amplifier 32 which receives on its input a signal at the intermediate frequency in the L band.

In accordance with the present invention and as represented in FIG. 3, the frequency conversion device comprises a second mixer 33, preferably identical to the first mixer 31. This second mixer 33 receives on one of its inputs the signal arising from the local oscillator phase-shifted by 90° by a phase shifter 34. The other input of the mixer 33 receives a dc signal, more particularly a signal whose value is representative of the power of the unwanted residual spectral component at the output of the device, as will be explained in greater detail hereinafter. The outputs of the mixers 31 and 33 are sent to an adder 35 which outputs a signal transposed to the Ka band which is sent in a conventional manner to an intermediate amplifier 36.

Figure 6:
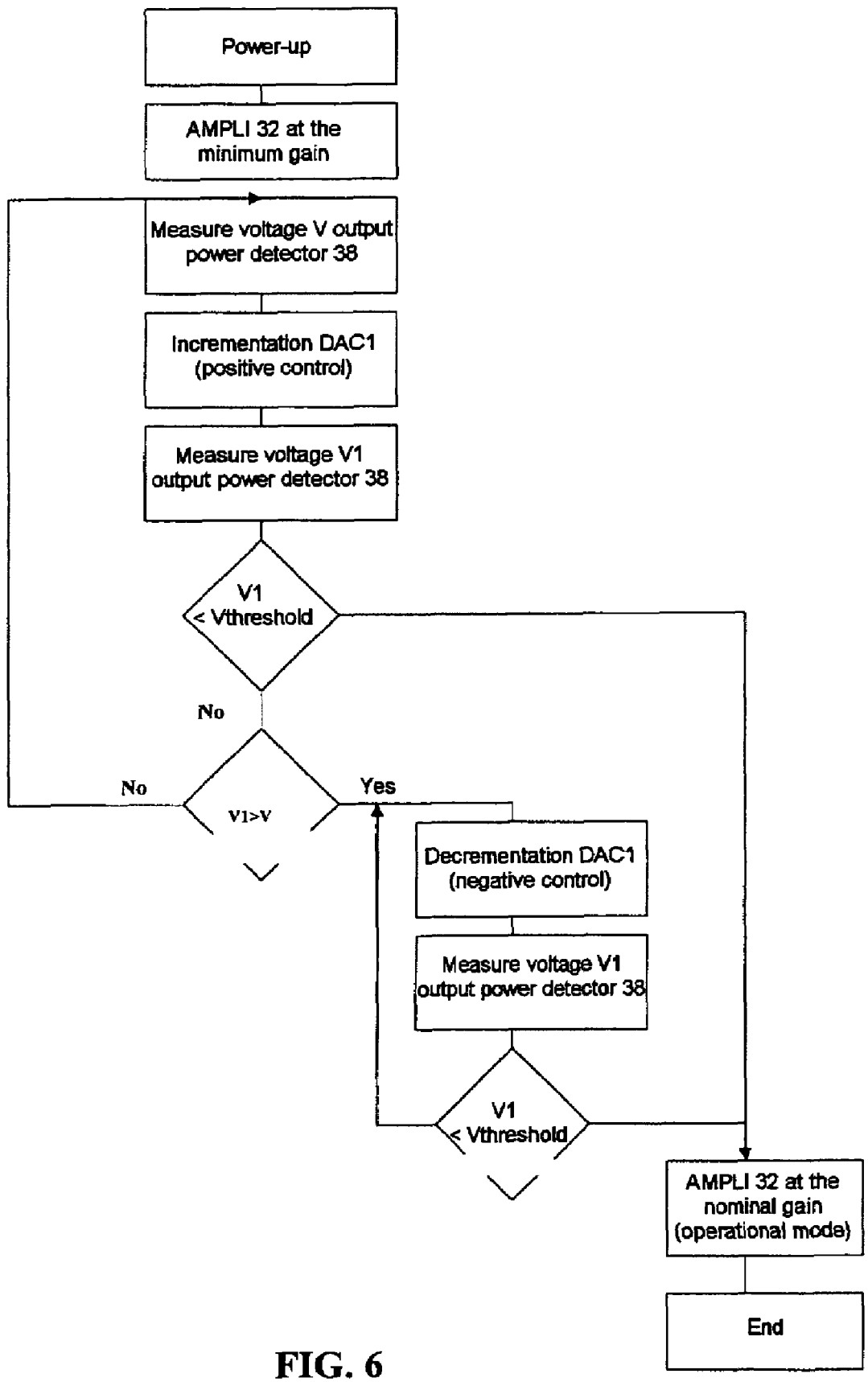
FIG. 6 is a flow chart explaining the operation of the microcontroller.

Moreover, in accordance with the present invention, the signal output by the adder 35 is coupled by way of an amplifier 37 to a power detector 38 which outputs a dc voltage representative of the power of the unwanted residual spectral component at the output of the adder. As represented in FIG. 3, this dc voltage is sent to a digital/analogue converter which, in the embodiment represented, is part of a microcontroller 39. This analogue/digital converter referenced ADC digitizes the dc voltage. In the microcontroller, the direction of variation of this dc voltage is calculated with the aid of a convergence algorithm so that the device can converge. The flow chart represented in FIG. 6 illustrates the mode of functioning of the device. When the voltage measured at the output of the power detector is less than a programmed threshold voltage (V threshold), the gain of the amplifier 32 is set to its nominal gain and the transmitter becomes operational.

In fact the direction of variation of the voltage to be applied to the second mixer is dependent on the characteristics of the diodes constituting the mixers and is not known at the outset. The signal obtained following the calculation is sent to a digital/analogue converter referenced DAC1 which is integrated with the microcontroller in the embodiment represented, in such a way as to apply the desired dc voltage to the second input of the mixer 33. Moreover, as represented in FIG. 3, the microcontroller sends a control voltage by way of a second digital/analogue converter referenced DAC2 so as to control the gain of the amplifier 32 during the method of calibrating the device and during the operational mode.

Hence, the calibration of the device in accordance with the present invention will be described hereinafter.

On power-up, the frequency of the local oscillator 30 being programmed in the Ku band, the amplifier 32 operating in the L band is firstly controlled by the microcontroller 39 in such a way as to operate with a minimum gain so as to attenuate to the maximum the IF component at the input of the mixer 31.

A signal exhibiting a component at the frequency 2OL is obtained at the output of the adder 35. In accordance with the present invention, the power of the component at 2OL is detected by the detector 38 which feeds the microcontroller 39 with a dc voltage as a function of this power. At the input of the microcontroller 39, the dc voltage delivered by the detector is converted into a numerical value and then processed in the microcontroller so as to obtain an output voltage which, once converted into analogue by a first digital/analogue converter DAC1, will control the second IF input of the mixer 33.

The direction of the control function is dependent on the characteristics of the diodes implemented in the mixer and is variable. The direction of variation is calculated by the microcontroller by checking the convergence of the loop corresponding to a power minimum of the residual component at the output of the adder.

When the component at the frequency 2OL is minimized at output, the frequency conversion device is in an operational mode and the gain of the amplifier 32 is set to its nominal value by the microcontroller 39.

Figure 4:
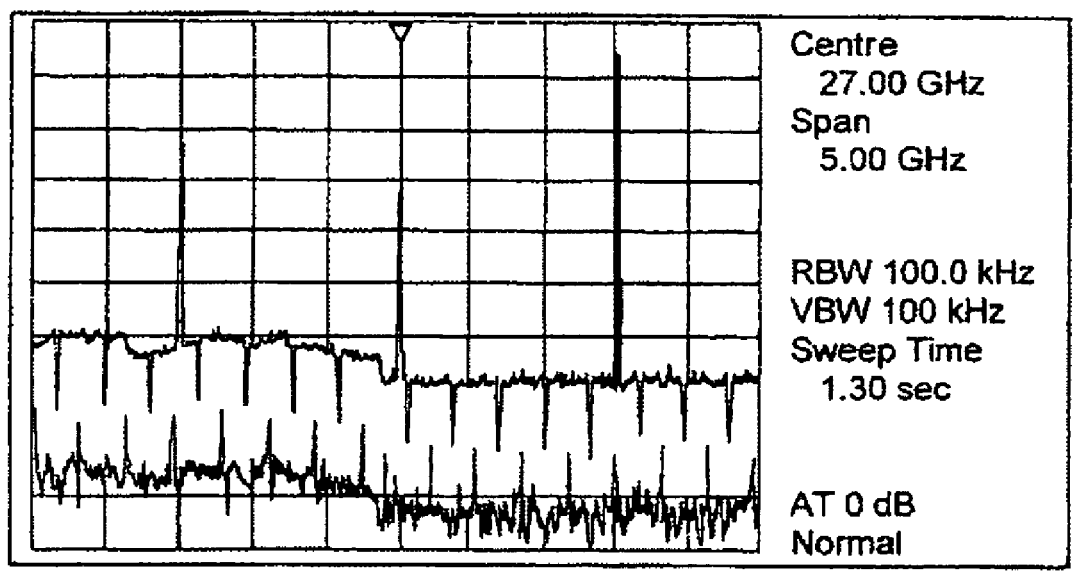
FIG. 4 represents the profile of the spectrum at the output of a subharmonique mixer in the Ka band without compensation.
Figure 5:
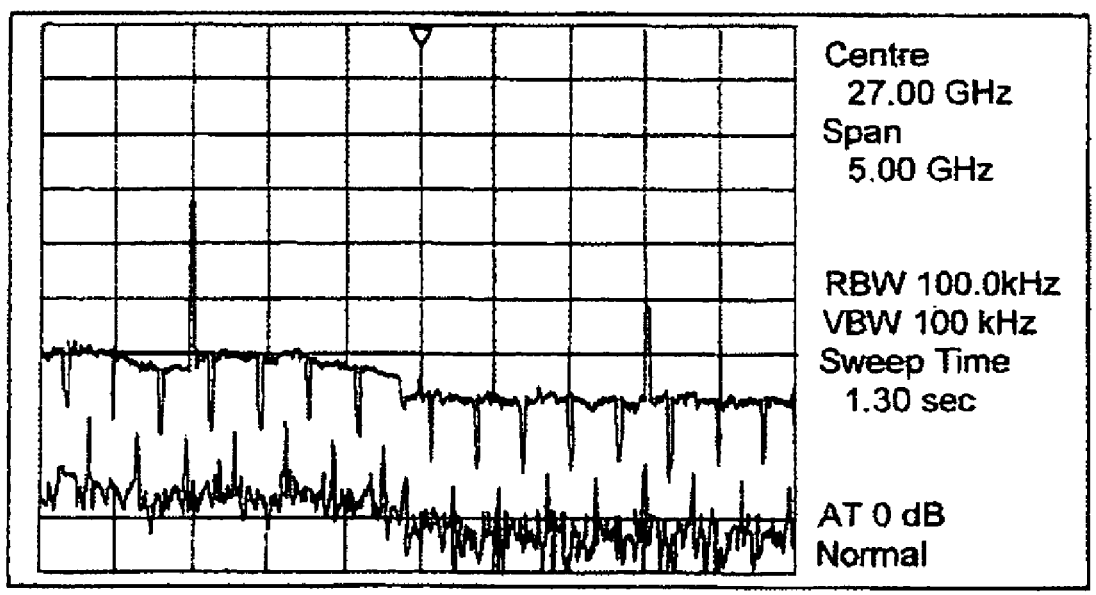
FIG. 5 represents the profile of the spectrum at the output of a subharmonique mixer in the Ka band with the compensation device in accordance with the present invention.

To show the results obtained with the frequency conversion device in accordance with the present invention, the profile of the spectrum at the output of a subharmonique mixer 2 in the Ka band without compensation and with compensation has been represented in FIGS. 4 and 5. The main conditions of compensation are as follows:

1 Input Parameter:
Intermediate frequency FI=1.5 GHz
Input power of the IF signal: −8 dBm
Power on the OL input: +6 dBm
Frequency of the local oscillator: FOL=13.5 GHz (virtual OL at 2FOL=27 GHz)

2 Performance at Output:
Power of the useful signal at 28.5 GHz: −15 dBm.
Power of the residual component at 2OL measured at output=−40 dBm.

A line at the frequency 2OL is therefore observed in FIG. 4. If one examines FIG. 5 which illustrates the results of actual measurement at the output of a mock-up implementing the frequency conversion device in accordance with the present invention, in this case the extra attenuation of the component at the frequency 2OL, namely 27 GHz, is greater than 30 dB. In this case, the performance in terms of rejection of the component at 2OL is independent of the power and of the IF frequency. This device therefore makes it possible to function with a very low intermediate frequency since the performance of the device is independent of the IF frequency.

The frequency conversion device in accordance with the present invention therefore exhibits a certain number of advantages, in particular it makes it possible to substantially reduce the costs of filtering in Ka band. Simple extra filtering based on a very cheap microstrip technique may then be deployed. Moreover, the footprint of the function is reduced and the amplitude-wise linearity constraints of the amplification chain may be less significant.

What is claimed is:

1. A device for converting frequencies comprising a local oscillator of fixed frequency and a first mixer with two inputs and an output, a first input receiving the signal to be converted and a second input receiving the signal arising from the local oscillator, wherein said device comprises a second mixer with two inputs and an output, a first input receiving a phase shifted version of the signal from said local oscillator and a second input receiving a dc signal whose value is dependent on the power of the residual spectral component at the output of an adder receiving as input the signals arising from the first and from the second mixer(s) and giving as output a transposed signal.

2. A device according to claim 1, wherein the device further comprises a power detector coupled to the output of the adder for outputting a dc voltage dependent on the power of the residual spectral component at the output of the adder.

3. A device according to claim 2, wherein output of the power detector is sent to a processing means making it possible to determine the value of the dc signal to be applied as input to the second mixer.

4. A device according to claim 3, wherein the processing means is a microcontroller in which are integrated analogue/digital and digital/analogue converters.

5. A device according to claim 3, wherein the processing means implements a convergence algorithm for determining as a function of the value of the voltage arising from the detector the value of the voltage to be applied to the second mixer.

6. A device according to claim 1, wherein the signal to be converted is amplified by a variable gain amplifier before being applied to the first mixer, the gain of the amplifier being controlled by a signal arising from a microcontroller.

7. A method of calibrating the device for converting frequencies according to claim 6, wherein it comprises the following steps:
adjusting of gain of a variable gain amplifier for operation with a minimum gain on power-up,
measuring a power of a component at a frequency 2OL at an output of a power detector,
processing a voltage delivered by the detector so as to determine a value of a dc voltage to be applied to an input of a second mixer, and
setting the gain of the variable gain amplifier to its nominal value when the component at the frequency 2OL is minimized at the output.

8. A method according to claim 7, wherein the processing of the voltage at the output of the detector is carried out in a microcontroller implementing a convergence algorithm after digitization of the voltage.

9. A transmitting/receiving system comprising an outdoor unit carrying out in one leap the transposition of the intermediate RF frequency into a frequency to be transmitted of the order of a gigahertz, wherein it comprises a device for converting frequencies according to claim 1.

* * * * *